United States Patent [19]

Wason

[11] Patent Number: 5,020,108
[45] Date of Patent: May 28, 1991

[54] AUDIBLE DISPLAY OF ELECTRICAL SIGNAL CHARACTERISTICS

[76] Inventor: Thomas D. Wason, 715 W. Johnson St., Raleigh, N.C. 27603

[21] Appl. No.: 453,352

[22] Filed: Dec. 18, 1989

Related U.S. Application Data

[63] Continuation of Ser. No. 46,623, May 4, 1987, abandoned.

[51] Int. Cl.$^5$ .............................................. G10L 5/00
[52] U.S. Cl. ...................................... 381/48; 281/30; 281/29; 342/28
[58] Field of Search ................ 381/30, 48, 29; 342/28

[56] References Cited

U.S. PATENT DOCUMENTS

Re. 32,580  1/1988  Atal et al. ............................ 381/40
3,988,546  10/1976  Di Toro ................................. 381/29

Primary Examiner—Emanuel S. Kemeny
Attorney, Agent, or Firm—Rhodes, Coats & Bennett

[57] ABSTRACT

Various selected characteristics of digital (or analog) signals in an electrical circuit are converted into audible signals and transmitted as a sound pattern(s) through a speaker or headphones to a user. Such selected signal characteristics include pulse width, duty cycle, activity level (state changes), repetitive pattern comparison, and sampled signal level. Some representative types of differentiable noise or sounds include clicks, pitch, harmonics, noise bursts, ticks and tocks, and voice stopped consonants. By matching selected noise types with selected characteristics an audible display is generated which represents to the user various characteristics of the sampled signal either individually or collectively.

20 Claims, 19 Drawing Sheets

AUDIBLE DISPLAY OF ELECTRICAL SIGNAL CHARACTERISTICS

This application is a continuation of application Ser. No. 07/046,623, filed May 4,1987.

BACKGROUND OF THE PRESENT INVENTION

This application relates to audible displays and more particularly to the conversion of various salient features of signals in an electrical circuit (digital or analog) into audibly distinct sounds which are transmitted to a user through a speaker or headphones.

Electrical circuits generate signals which include various salient features reflective of many types of significant information therein. It is often necessary to test or sample such signals either to see if the circuit is operating correctly or to gather intelligible information from the various features thereof. One widespread technique for sampling signals from electrical circuits and visually displaying various characteristics thereof is by means of an oscilloscope which produces a visual display of one or more electrical signals. The display on an oscilloscope screen carries various types of differentiable information of the signal being sampled. Such signal characteristics include pulse width, duty cycle, activity level, signal level, pattern repetition comparison, and others. A test operator or user can visually determine whether the various characteristics of the signal are proper, or alternatively gather significant information from the various characteristics of the electrical signals which characteristics may be representative of the proper functioning of equipment, or even the monitoring of physiological aspects of the human body.

While the oscilloscope is undoubtedly a highly important and useful electronic instrument, there are limitations to its usefulness. First of all, of course, the operator or user must be able to see the oscilloscope screen. In addition to the obvious situation that this is impossible for a blind operator, there are many other instances when it is disruptive to the test procedure or other operation being carried on to shift visual attention of the operator from the electrical circuit, equipment, work piece, or portion of the human anatomy being worked upon at the time to the oscilloscope or other visual display to view the sampled signal or features thereof. In such instances, the only known manner to accomplish this is to have a second person reading the results from the visual display. This is obviously not always a satisfactory solution either from the standpoint of efficiency and economy or from the standpoint of satisfactory utilization of operator skills.

Human hearing is a remarkable sense or attribute of the central nervous system, especially in its ability to provide discrimination information. Human beings can recognize a familiar voice over the telephone in a second or less because of sound differences; a mother can distinguish the difference between the "fussing" and "distress" cries of her baby. Automobile operators all have the experience of detecting malfunctions in their vehicles simply because of sound differences. Similarly, doctors and automobile mechanics gain valuable information from the stethoscope.

There have been some rather primitive attempts to utilize sound as an indication of a limited feature of an electrical signal. For example, one type of auditory analysis of electrical signals, represented by U.S. Pat. Nos. 4,160,206; 4,321,530; and 4,350,951, generates an audible test signal responsive to a single electrical aspect to be tested. For example, the tone difference in the audible sound is generated when a measured electrical characteristic, such as voltage, current, or resistance, has exceeded a prescribed range.

In a second type of audible signal generator, evidenced by prior literature, binary information is translated from some type of meter, such as a volt meter, to an audible signal. This is relatively easy by utilizing such features as note pitch to discriminate between the two states of a binary signal. Thus, a high pitch may be indicative of a 1 and a low pitch may be indicative of a 0. The output signal is thus a code of high and low pitches which is indicative of a binary number.

A third type of auditory electrical signal device is what is referred to as a "signature analysis test procedure" where the signal at a prescribed node is compared with a standard or good signal. An audible sound, such as a beep, indicates "pass" or "fail." Also, as taught in U.S. Pat. No. 3,800,082 a type of reading machine has been developed which converts two-dimensional patterns into frequency and amplitude auditory signals for blind persons to enable them to determine various shapes. In this approach, a television camera scans a two-dimension pattern and the vertical position of the scan is represented by the frequency of the tone heard while the horizontal position of the scan is represented by amplitude.

While auditory signal generators, as described hereinabove, have been utilized in the limited senses set forth it is not believed that audible displays have been used to analyze simultaneously or collectively the different salient features of an electrical signal in the manner that an oscilloscope is used to visually analyze such signals.

SUMMARY OF THE PRESENT INVENTION

The present invention, therefore, is directed to a technique that allows an engineer, technician, or physician to hear a representation of an electrical signal stream instead of watching it on an oscilloscope or other visual display. It is in essence a stethoscope for electrical signals. Further, the device of the present invention can be designed to function with an oscilloscope or actually be incorporated into an oscilloscope, giving the operator the alternative of visually or audibly testing an electrical circuit, or both.

The apparatus of the present invention is an audible display device that generates a plurality of audibly differentiable signals, each signal being representative of a salient feature of an electrical signal. Toward this end, the device includes a plurality of sub-circuits, each of which is capable of generating from the electrical signal an electrical waveform which will produce a distinctly separate audible pattern of sounds; a probe or some other type of sampling means for obtaining a digital electronic signal to be examined in supplying such signal to each of the plurality of sub-circuits; and some type of transducer (speaker, etc.) which electronically converts the waveforms to a distinct audible pattern of sounds for auditory display. While the sub-circuits sense digital signals, it is also within the purview of the present invention to analyze analog signals by first converting the input analog signal to a digital signal.

Some examples of the selected signal characteristics include pulse width, duty cycle, activity level, repetitive pattern comparison, and sampled signal level. Some representative types of noise or sound to be generated by the sub-circuits include clicks, pitch, harmonics, noise bursts, ticks and tocks, and voiced stopped consonants. By matching selected noise types with selected characteristics an audible display is generated representative to the operator or user of various characteristics of the sampled circuit. The selected characteristics can be displayed either individually or collectively.

The audible display of the present invention is designed to be used as an oscilloscope peripheral or as a stand-alone instrument. The audible display is the auditory analog to the visual oscilloscope and, thus, should be compatible with virtually all oscilloscopes. A buffer between the probe and peripheral oscilloscope taps off the digital signal for feature detection analysis and auditory display.

The auditory display of the present invention is designed to be used in certain applications by electrical/electronic engineers and technicians who are developing, testing, and repairing digital electronic circuits with the aid of an oscilloscope. When using an oscilloscope one must constantly shift his attention from the probe placement to the oscilloscope screen. During the process it is often desirable to be able to modify the circuit or shift the probe while viewing the screen. This is practically impossible with probes and an oscilloscope. Engineers and technicians are presently functionally "deaf" to their work and must rely on visual displays thereby limiting their efficiency and effectiveness.

The auditory display of the present invention may also be used as a small unit with no loud speaker and with no connection to any oscilloscope, particularly in field-type applications. Such a unit would be about the size of a belt clip-on radio which presently uses lightweight headphones. The auditory display could also be clipped to the belt of the service man, and would be used primarily by those who service and install telecommunication systems, personal and office computer systems, and the like.

The auditory display will function in a similar manner with logic analyzers and signal signature analyzers. Another application for the auditory display of the present invention is in conjunction with medical instruments. Certain medical instruments have been developed to analyze electrical signals from the brain. These instruments include a visual display, as well as the more common place electrocardiographs and other equipment used by neurosurgeons and cardiac surgeons, to monitor various physiological functions electronically during surgical or laboratory procedures. Presently with existing visual displays a second person must monitor the equipment and tell the surgeon what is happening electronically so that the surgeon can continue to concentrate on the area of the human anatomy with which he is concerned.

Other applications of the present invention as envisioned at the present time, include control panel auditory displays to be used in airplane cockpits during the preflight check list or to continuously audibly monitor various functions during flight. While the present invention is generally described as being utilized in conjunction with a probe or set of probes for test purposes it should also be recognized that the sampling procedure could be electronically controlled either by some type of rotary switch, or by some type of digital logic. The audible output may either be monaural or stereophonic, and, in addition to providing a single audible sound, the audible output of a tested circuit might be compared to a standard sound pattern carried in computer memory to enable the engineer to perform a type of "signature analysis" of the circuit. It should also be recognized that the input signal need not be limited to one, as two or more input signals could be tested individually or collectively.

More particularly, the auditory display of the present invention comprises a signal tapping device which initially senses for samples of the raw signal at a point or between two points in the electrical circuit to be analyzed. The signal is then transmitted through an electrical line to a buffer at which point the signal is divided, one portion to continue to the oscilloscope, and the other portion to be filtered, amplified, and transmitted along an electrical bus to feed each of the separate, auditory waveform generating sub-circuits. Each sub-circuit receives the input signal and electronically responds to a selected salient feature of that signal to generate a distinct waveform. The waveform is then transferred back to the bus line, through an amplifiers/filter, from whence it is converted to an audible sound or sound patterns by either a speaker, earphones, or some other type of transducer which converts electrical signals into sound waves. The selected sound patterns for each sub-circuit are designed to match speech characteristics for optimal human processing. The multiple channels of feature detectors thus produce an interesting complex sound pattern reflecting the signal characteristics. The human ability for auditory selective attention and the design of the sounds let the user separate the features as he wishes. Such signals includes particularly information—rich sounds when used on computer circuits, reflecting program and input changes. The auditory display of the present invention will increase the speed and efficiency of electronics engineers and technicians in evaluating circuits. Meaningful audible displays of physiological or physical activity are also within the scope of the present invention, which activity is converted into electrical signals representative of the features being monitored. Examples of physical activity include such activity as turbine speed, air flow, and steam pressure. It allows routine tests to be made without looking up from the work, verifies that the probe has not slipped off the test point, and calls attention to signal changes. The complex auditory display of the present invention is useful in operating rooms, laboratories, to companies which develop, manufacture and/or use digital electronics, as well as to companies which service and repair electronics.

It is therefore an object of the present invention to provide a unique type of technique for aurally displaying electrical signals.

It is another object of the present invention to provide an audible display of electrical signal characteristics.

It is yet another object of the present invention to provide an audible display of the type described in which selected characteristics of an electrical signal are generated into waveforms and converted into audibly differentiable sounds which may be transmitted through a speaker or headphones to an operator.

It is still another object of the present invention to provide an instrument through which an engineer, technician, surgeon, or other operator can actually "hear" a representation of a digital or analog signal rather than, or in addition to, watching a visual presentation.

Other objects and a fuller understanding of the invention will become apparent upon reading the following detailed description of a preferred embodiment along with the accompanying drawings in which:

FIGS. 1A–1C form an electrical block diagram/partial schematic of the auditory display circuitry of the present invention;

Figure 5A:
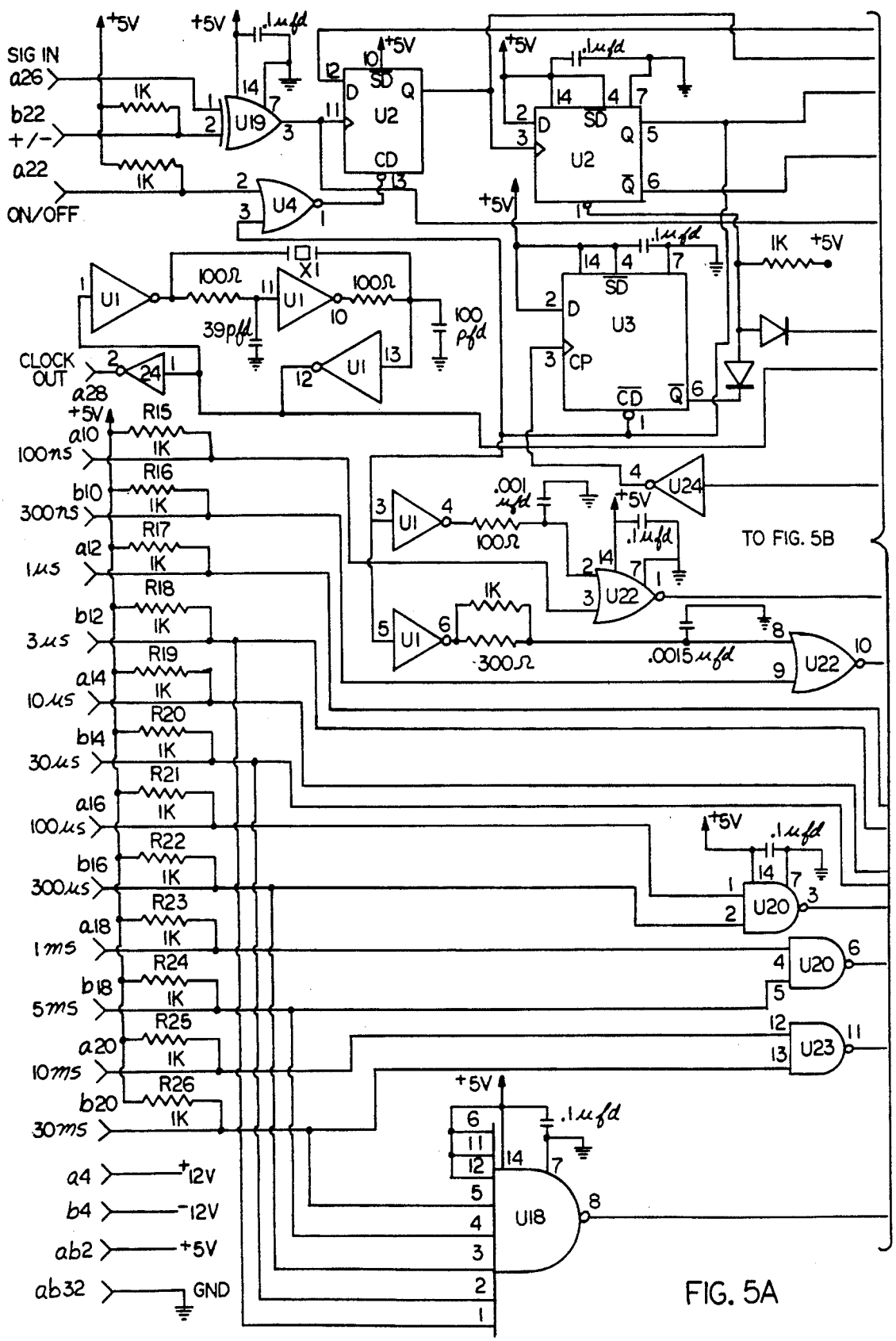
Figure 5B:
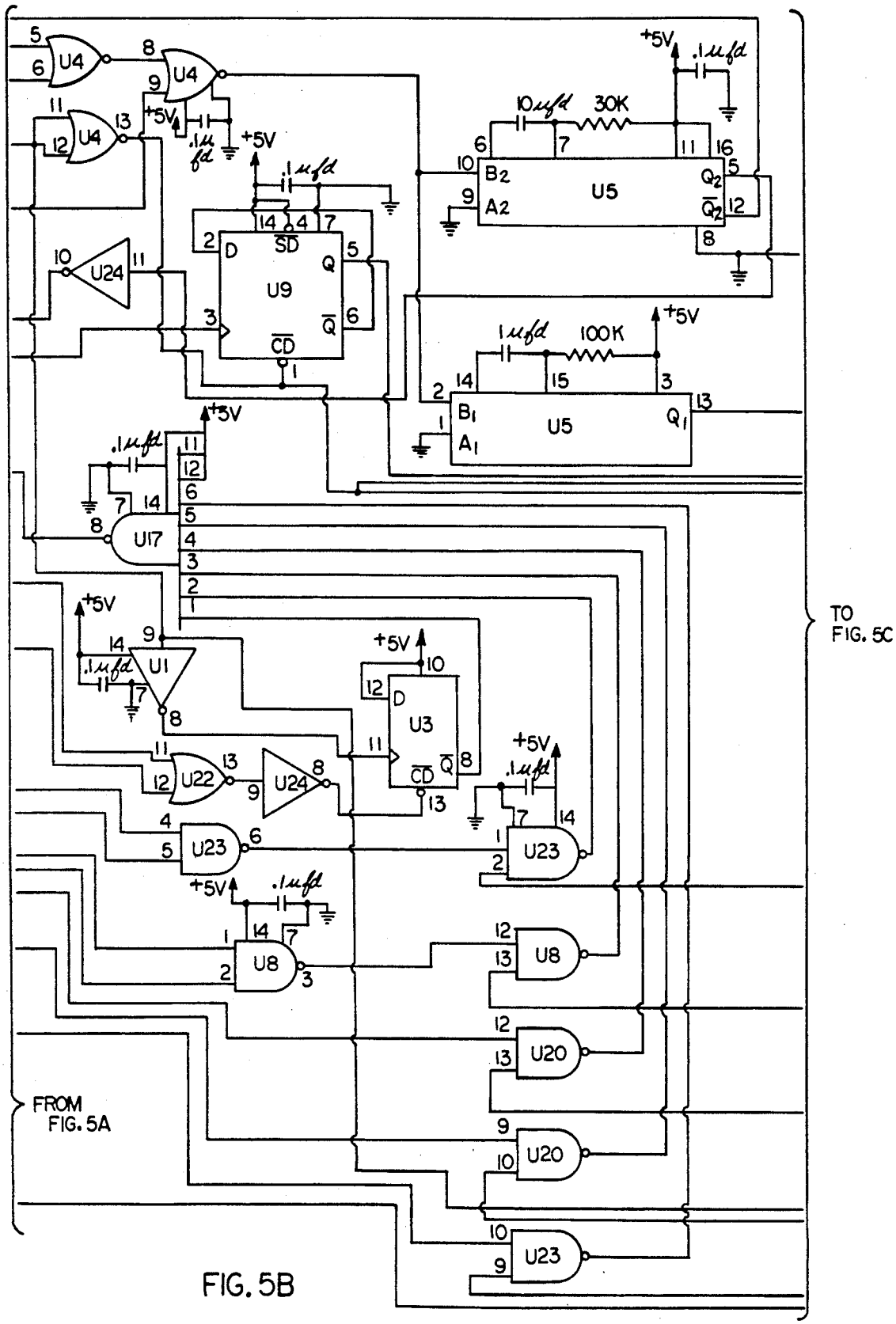
Figure 5C:
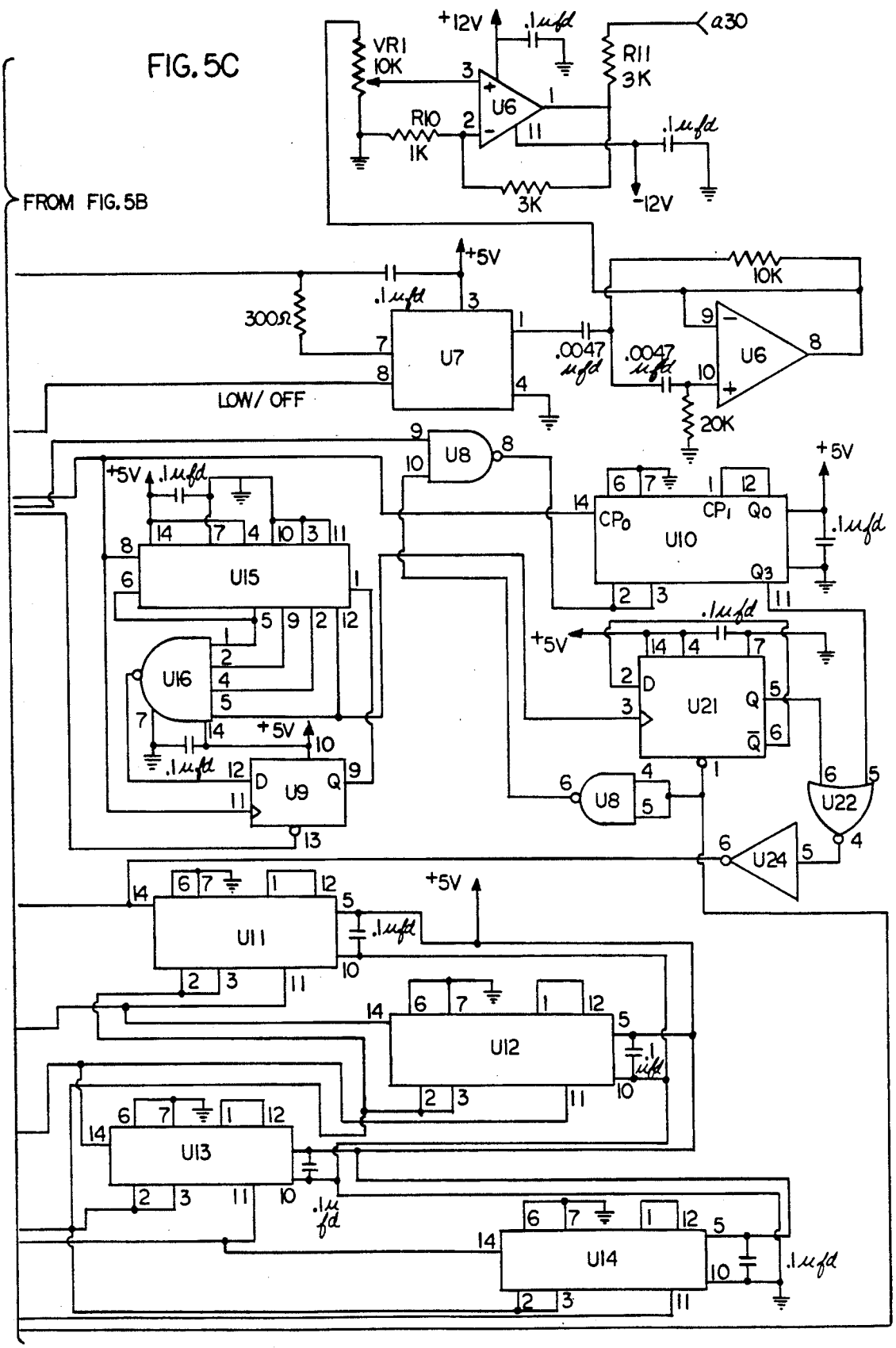
Figure 6A:
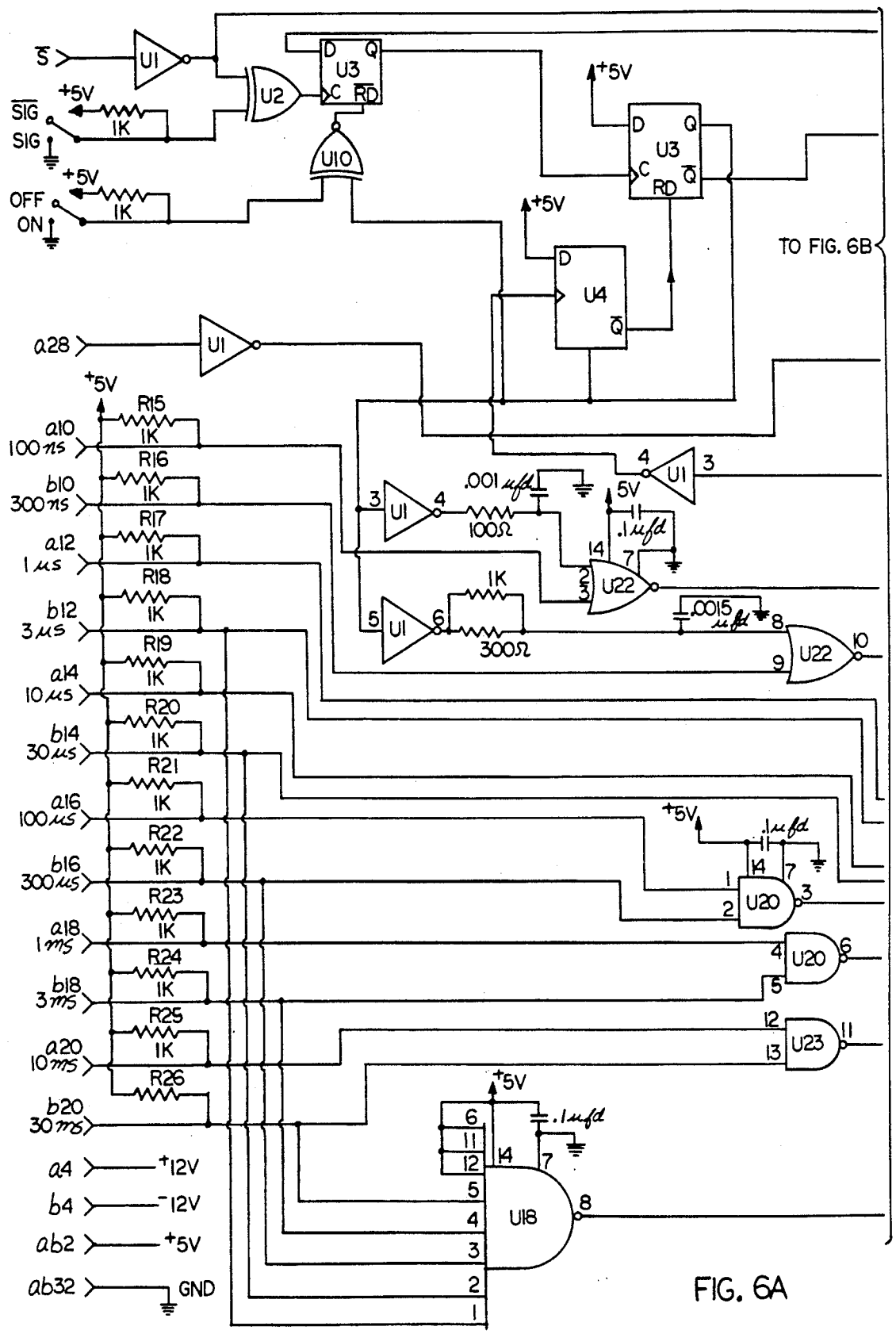
Figure 6B:
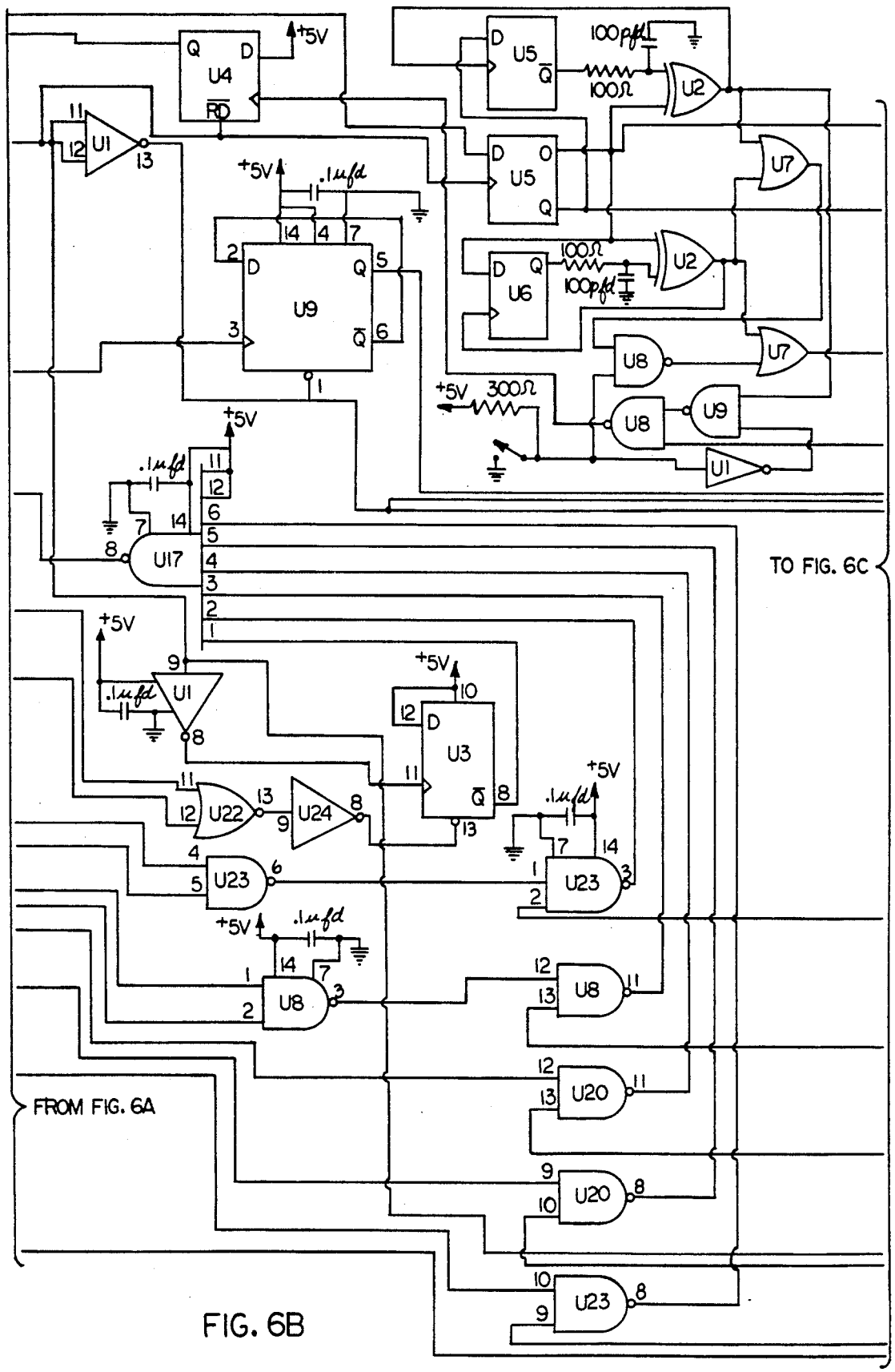
Figure 6C:
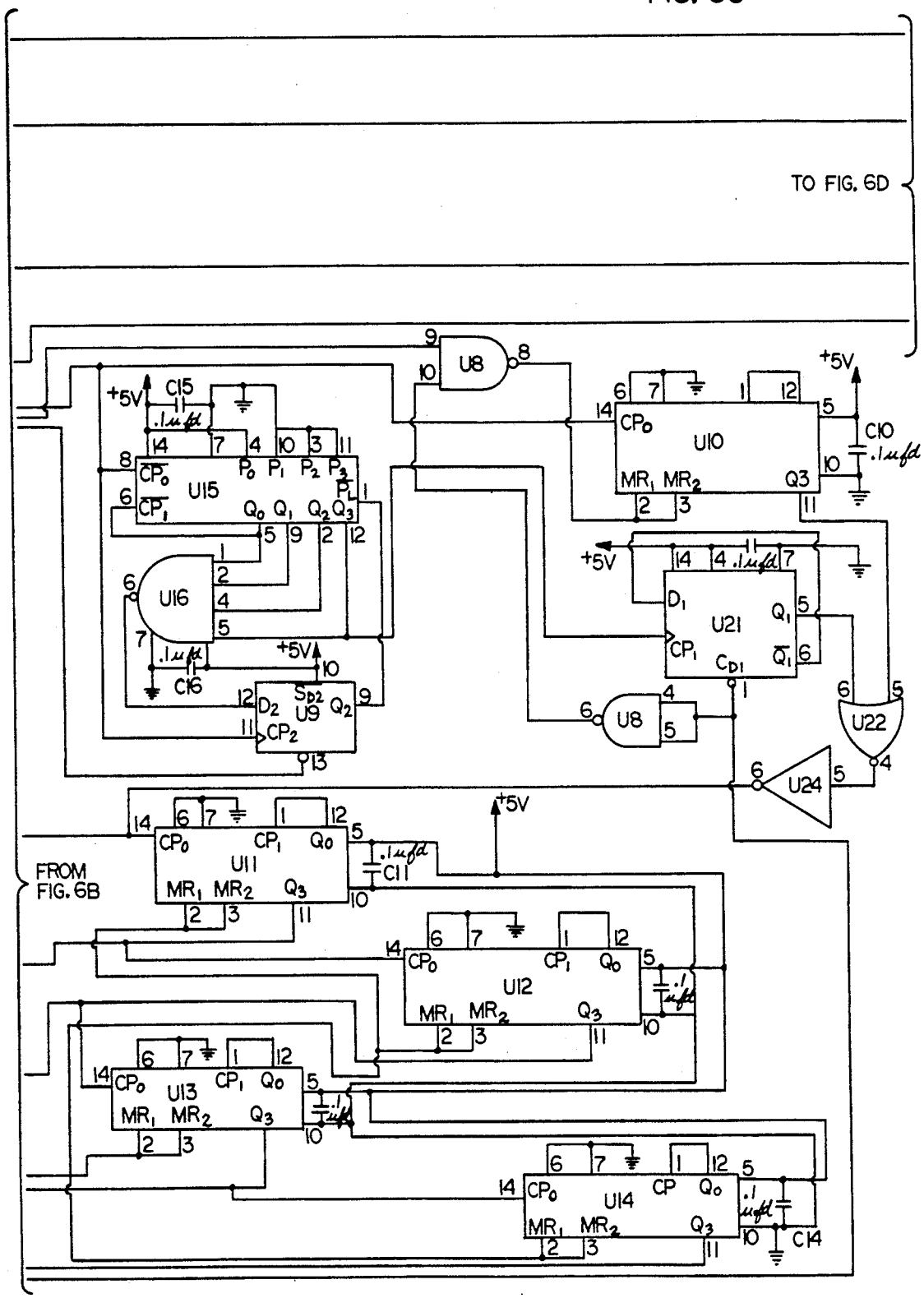
Figure 6D:
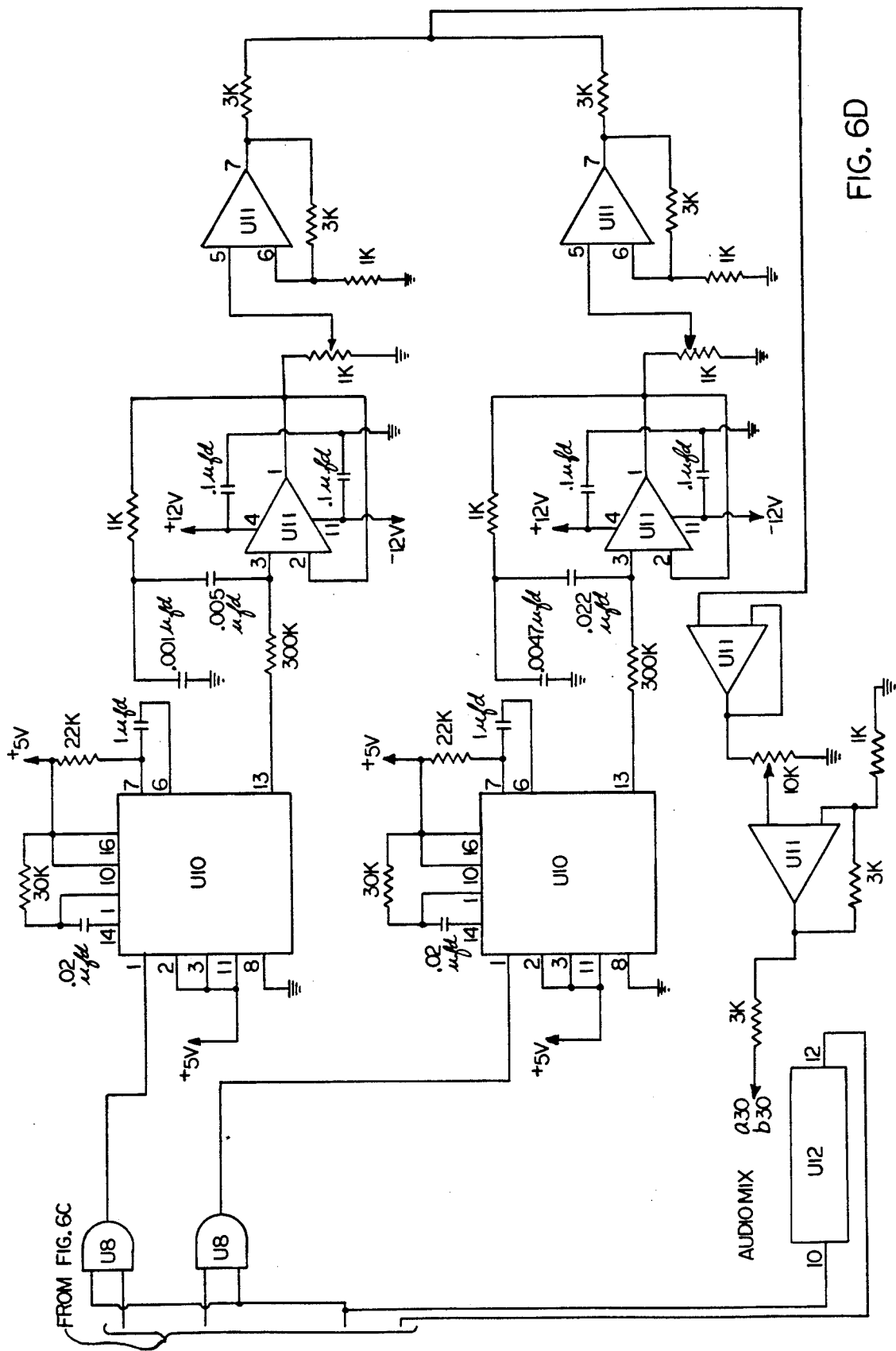
Figure 7:
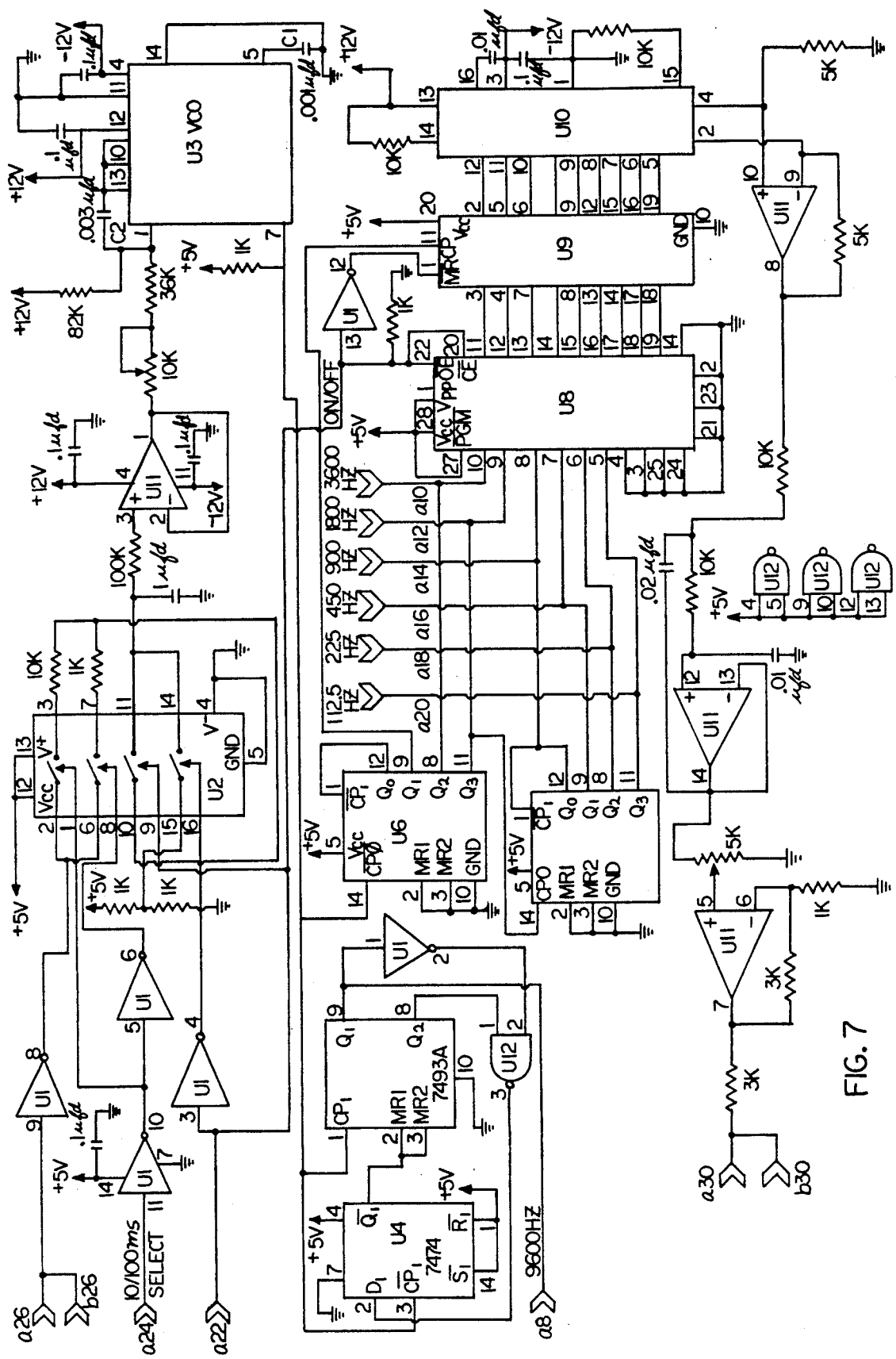
Figure 8:
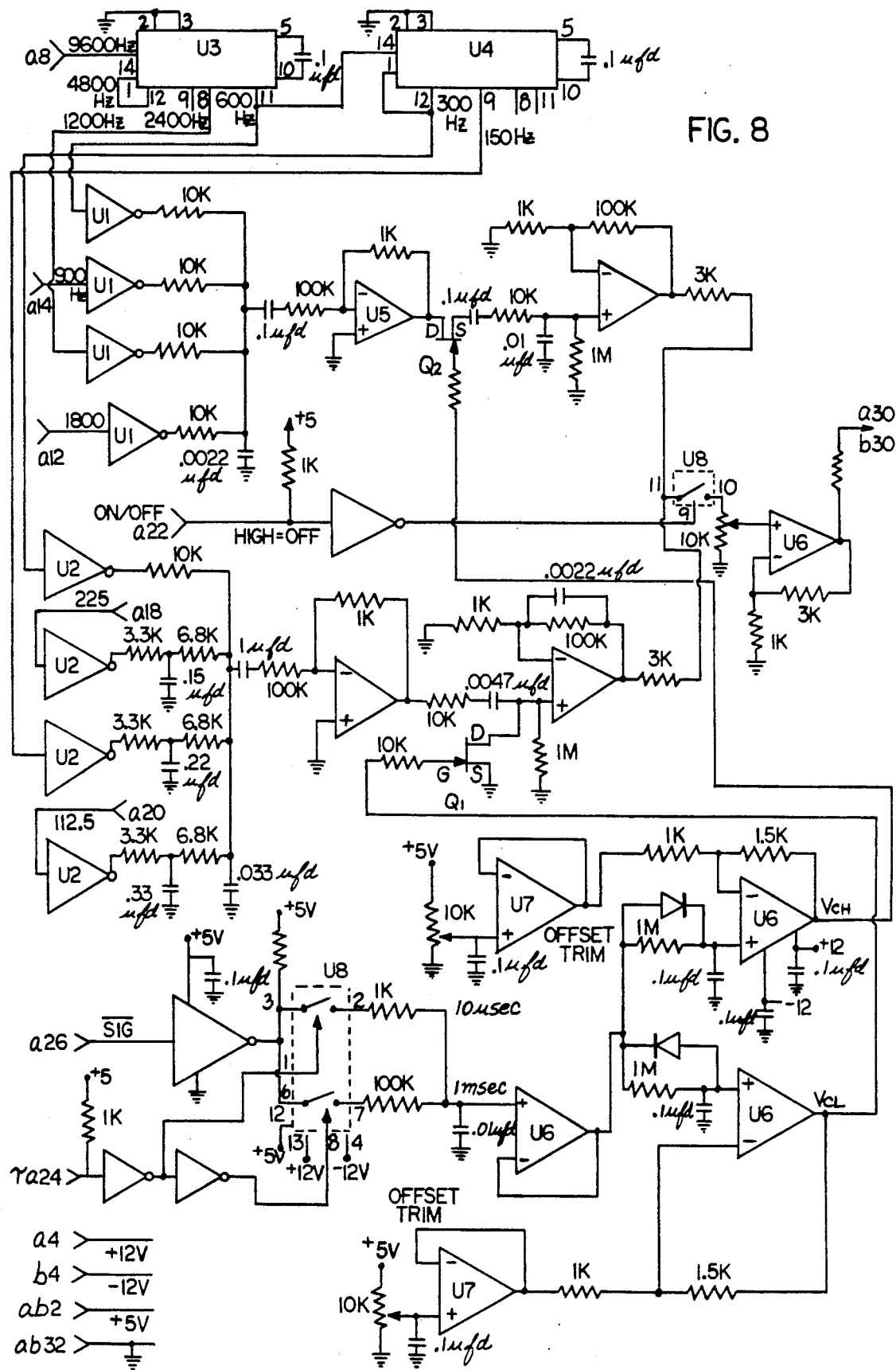
Figure 9:
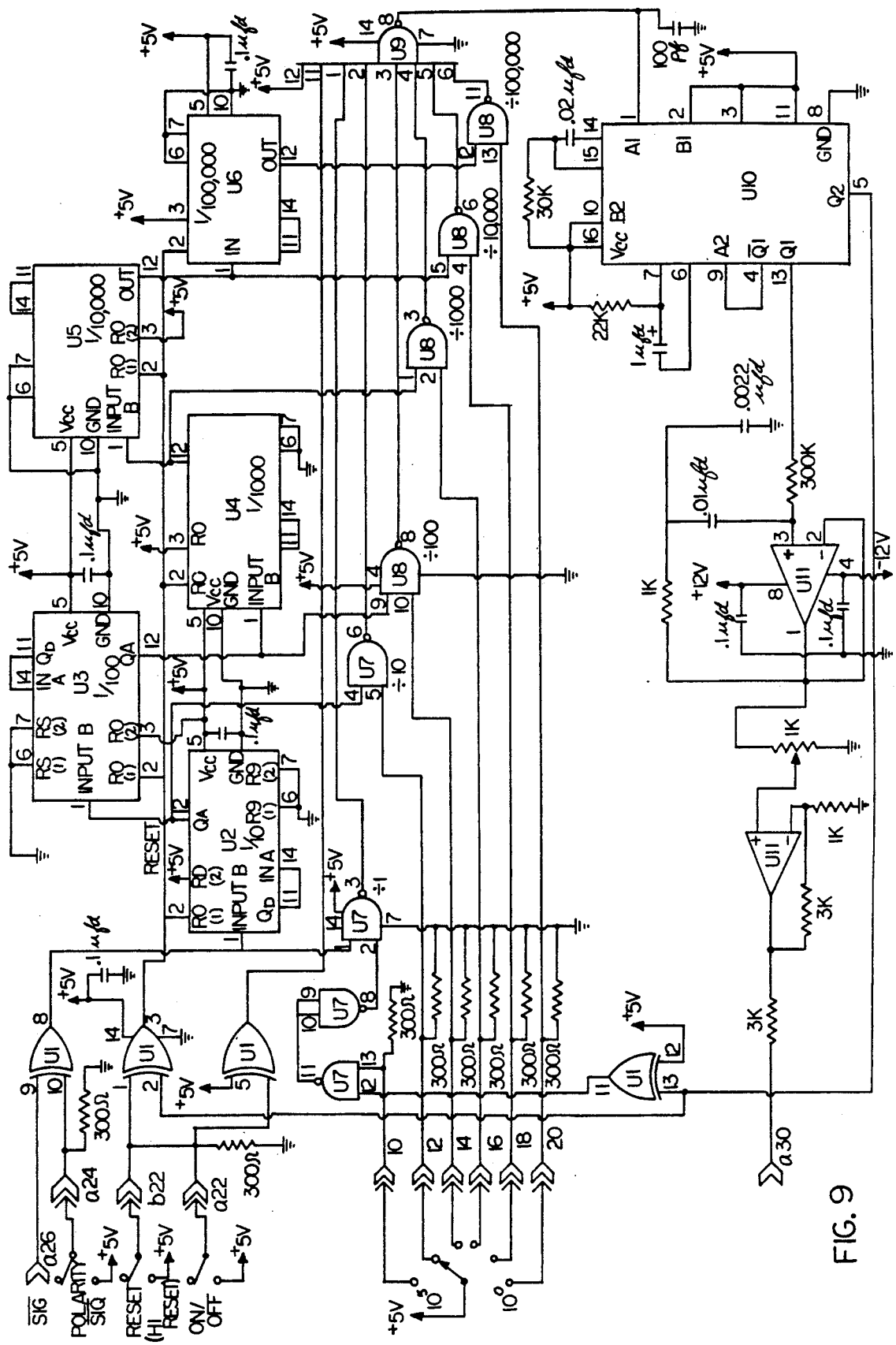
Figure 10A:
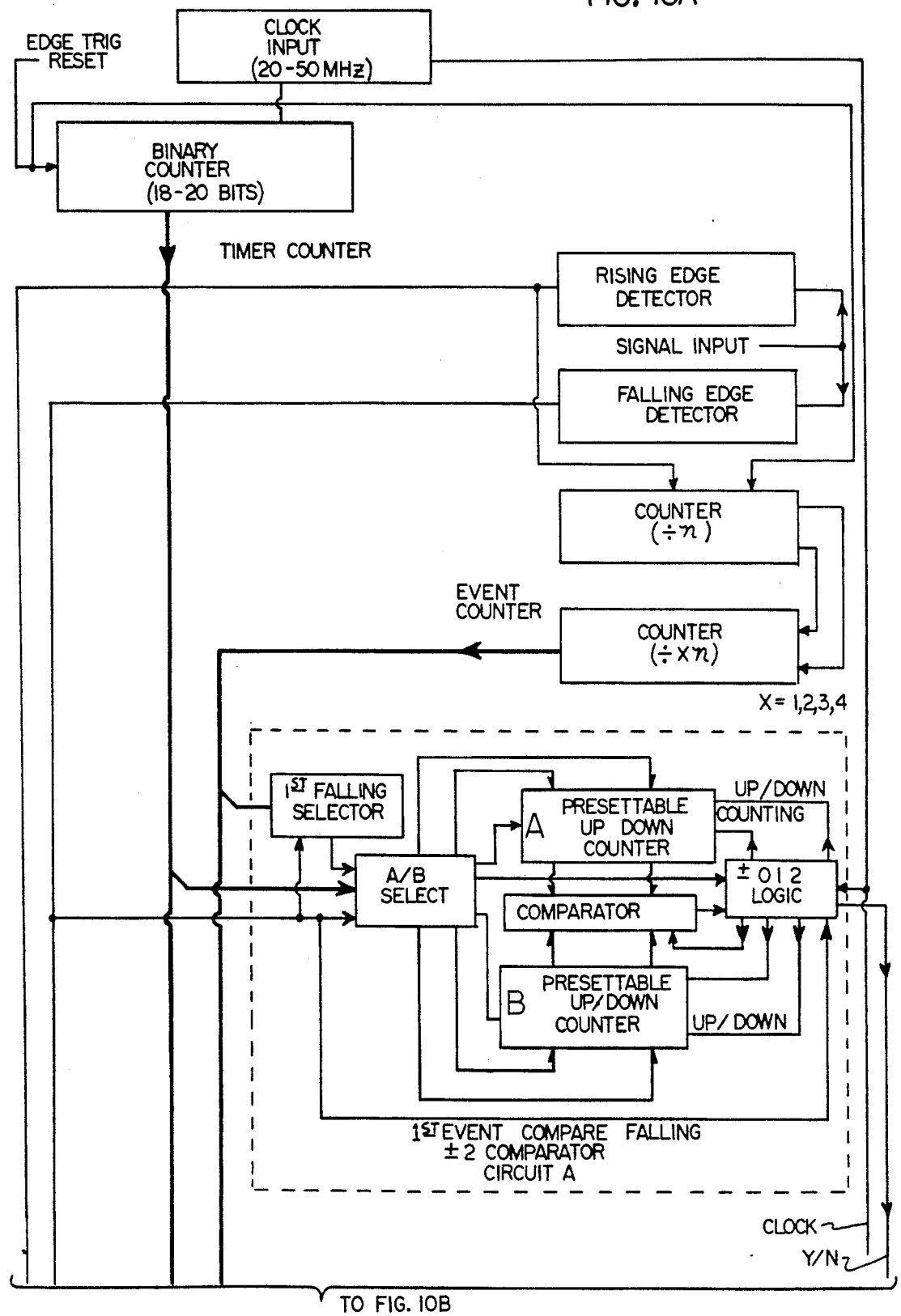
Figure 10B:
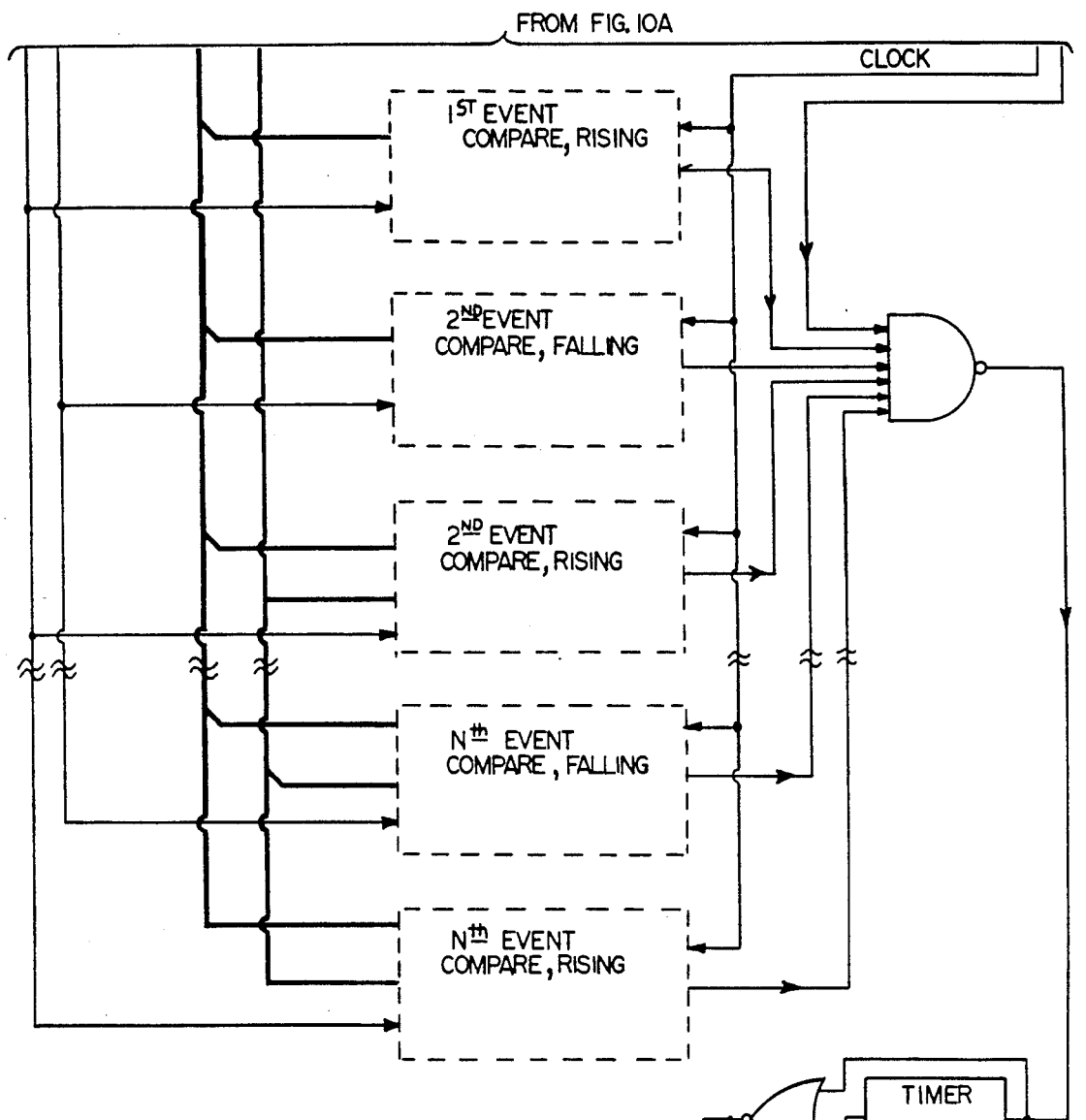
Figure 11:
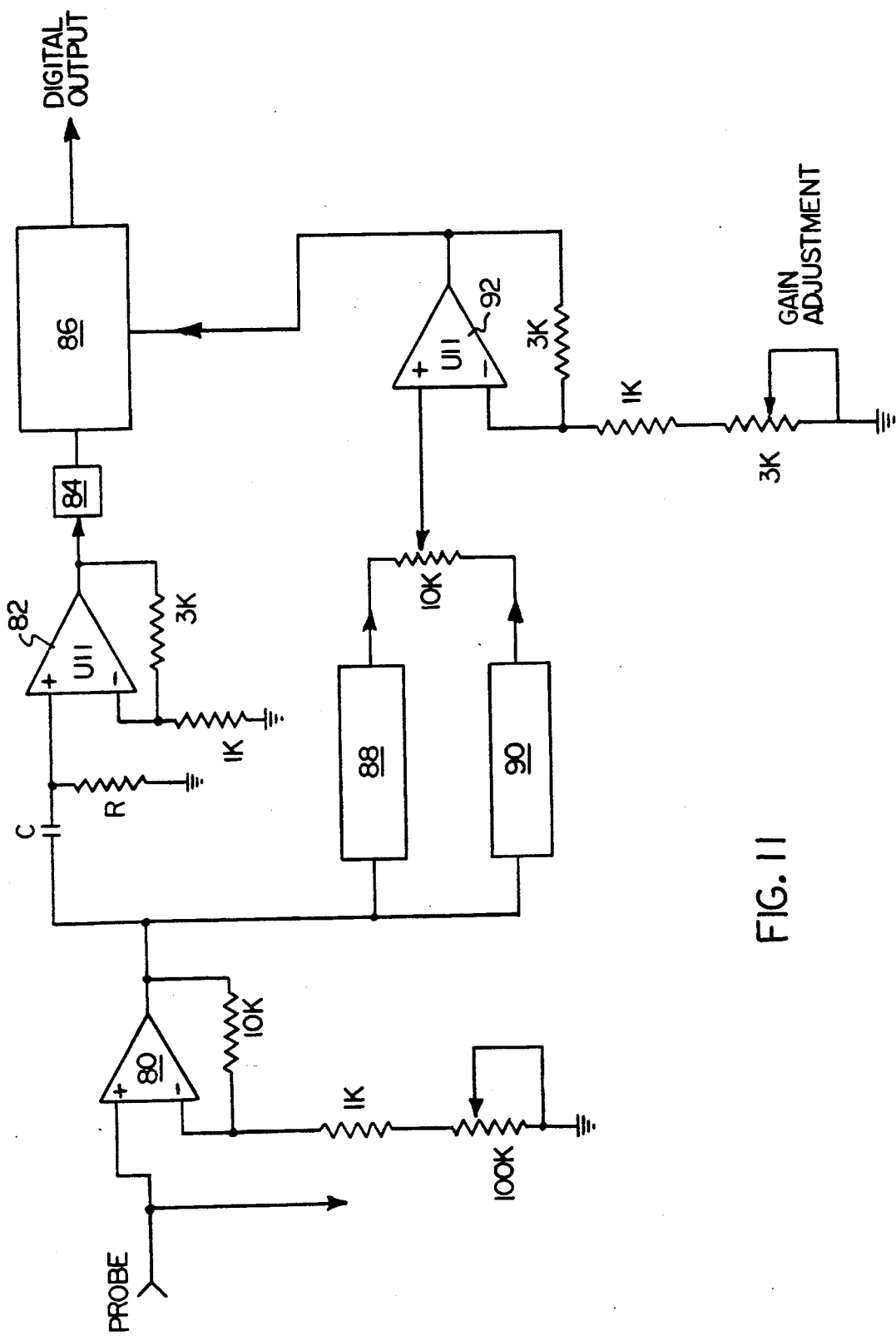

FIGS. 5A–5C form an electrical schematic illustrating the minimum pulse width detection sub-circuit;

FIGS. 6A–6D form an electrical schematic representing the delayed sampling sub-circuit;

FIG. 7 is an electrical schematic illustrating the mean duty cycle sub-circuit;

FIG. 8 is an electrical schematic representing the short term duty cycle sub-circuit;

FIG. 9 is an electrical schematic illustrating the activity level sub-circuit;

FIGS. 10A–10B form an electrical schematic illustrating a repetitive pattern comparison sub-circuit; and FIG. 11 is an electrical schematic illustrating an analog to digital signal conversion sub-circuit.

DETAILED DESCRIPTION OF A PREFERRED EMBODIMENT

Figure 1A:
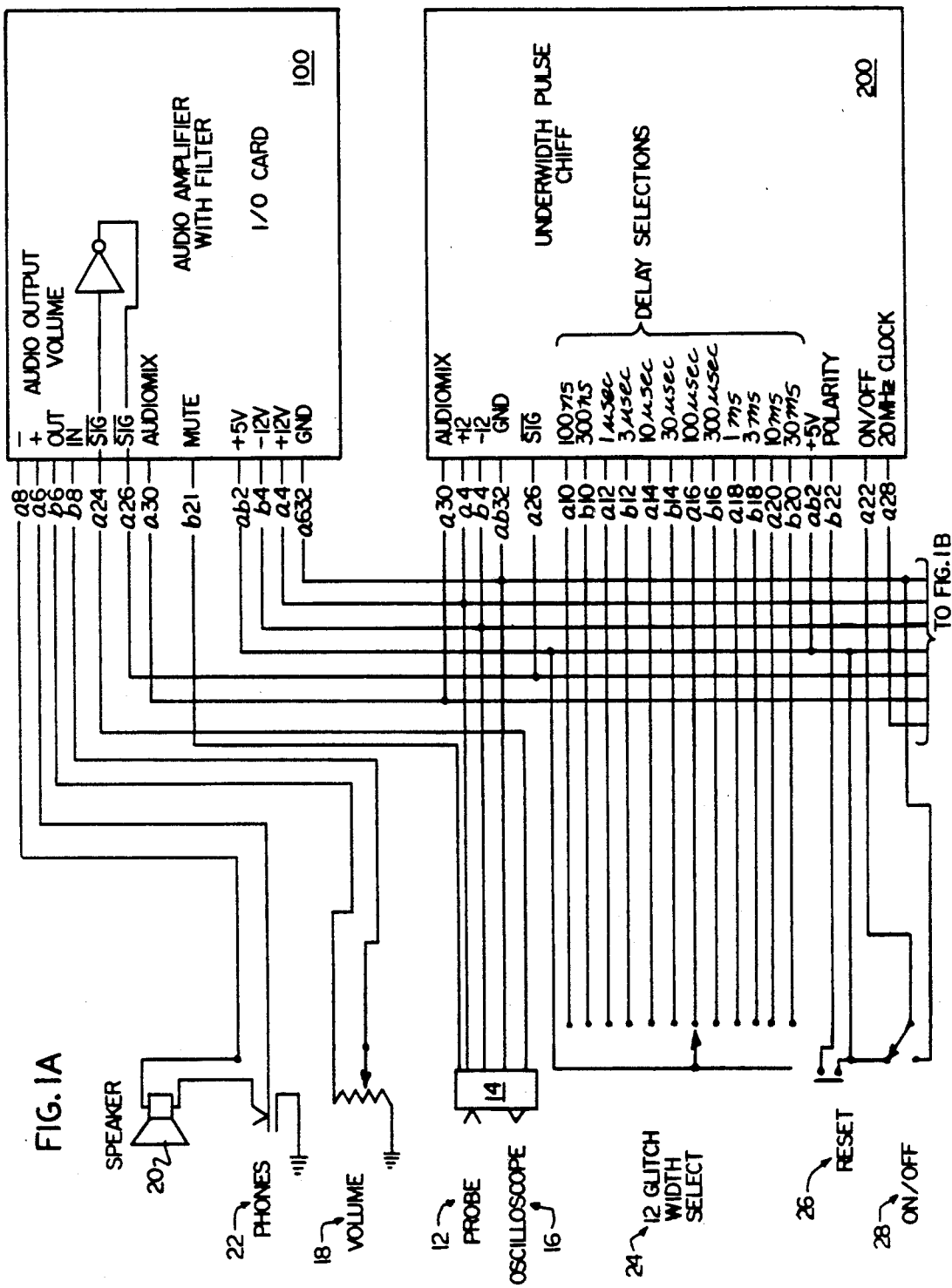
Figure 1B:
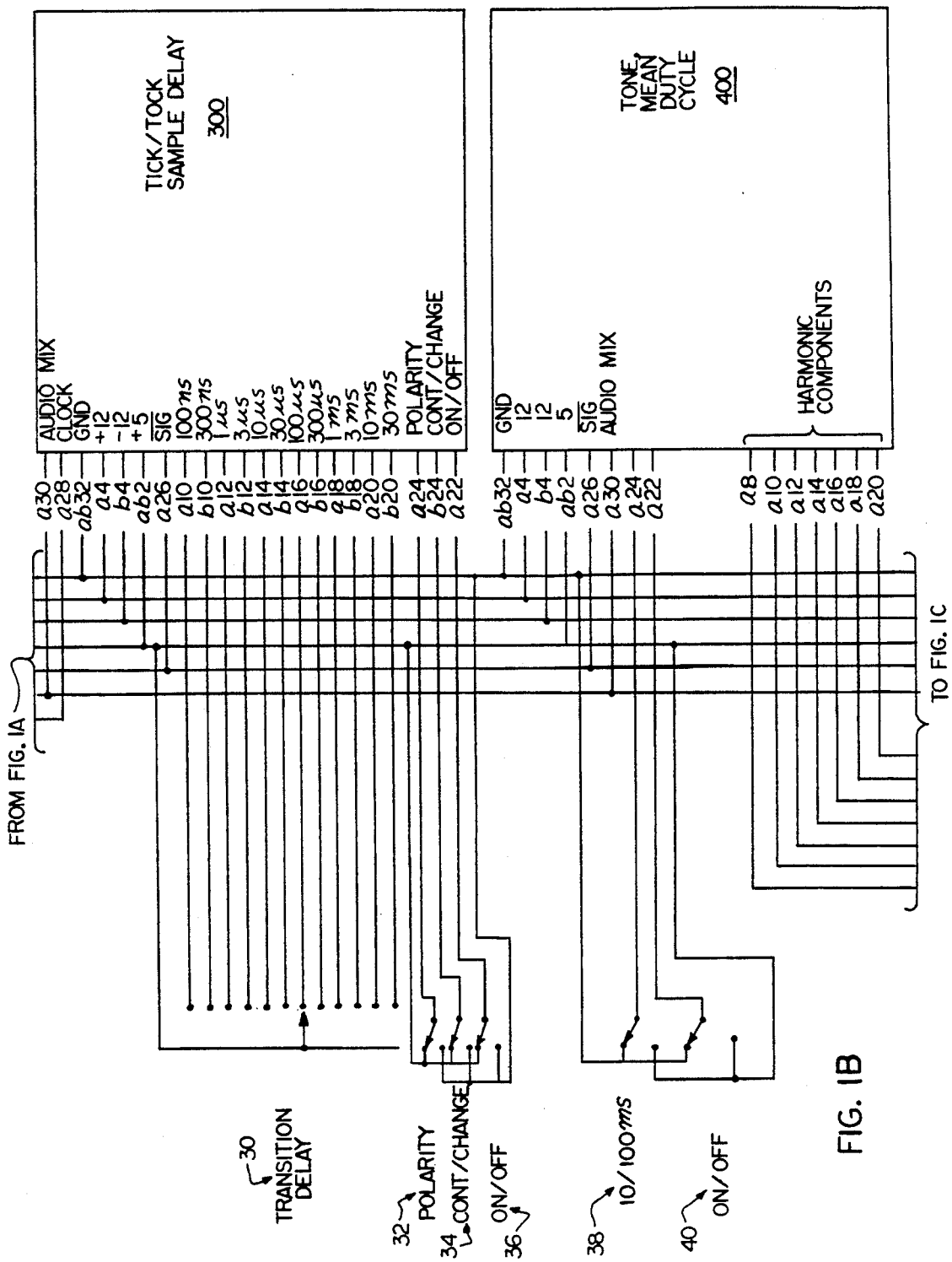
Figure 1C:
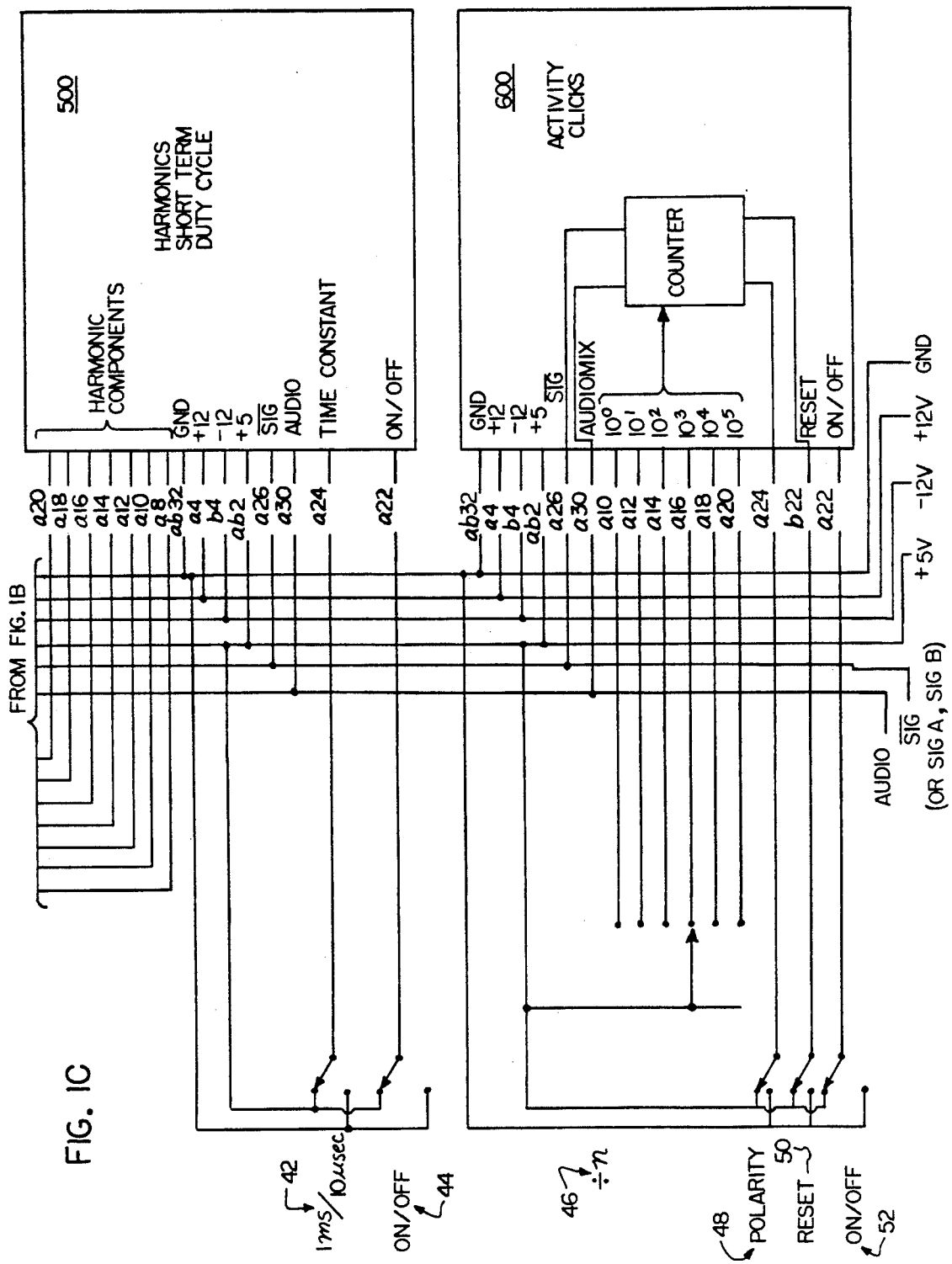
Figure 2:
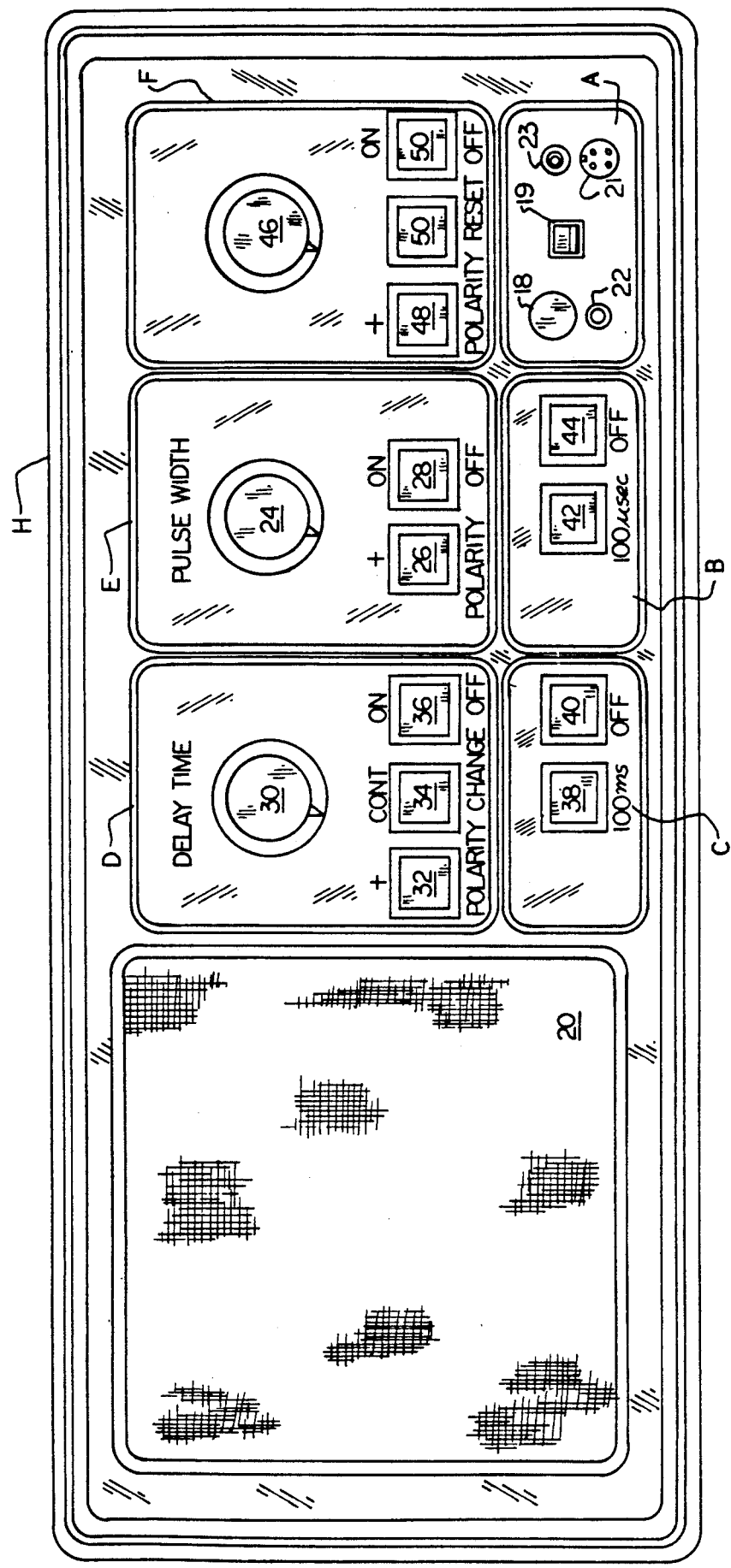
FIG. 2 is a front view of the front panel of the auditory display device according to the present invention.

Turning now to the drawings and first of all to FIGS. 1 and 2, there is illustrated the primary aspects of the auditory display instrument of the present invention. Perhaps the concept of the invention may best be understood by a review of FIG. 1 which is the overall electrical schematic, with each of the auditory signal forming sub-circuits illustrated in FIG. 1 in block diagram form, however, being illustrated in detail in FIGS. 5–10.

Figure 3:
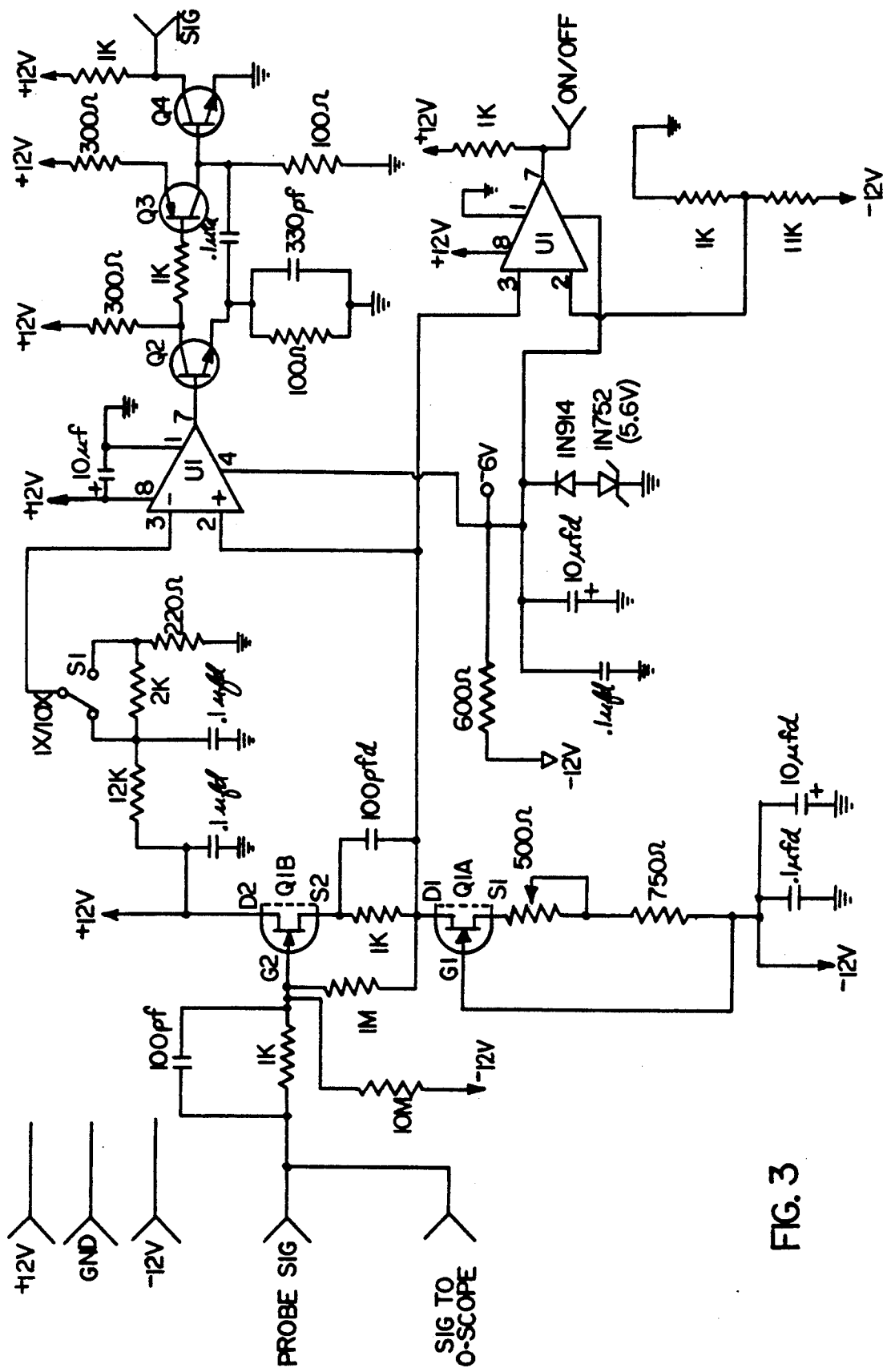
FIG. 3 is an electrical schematic illustrating the buffer box sub-circuit.
Figure 4:
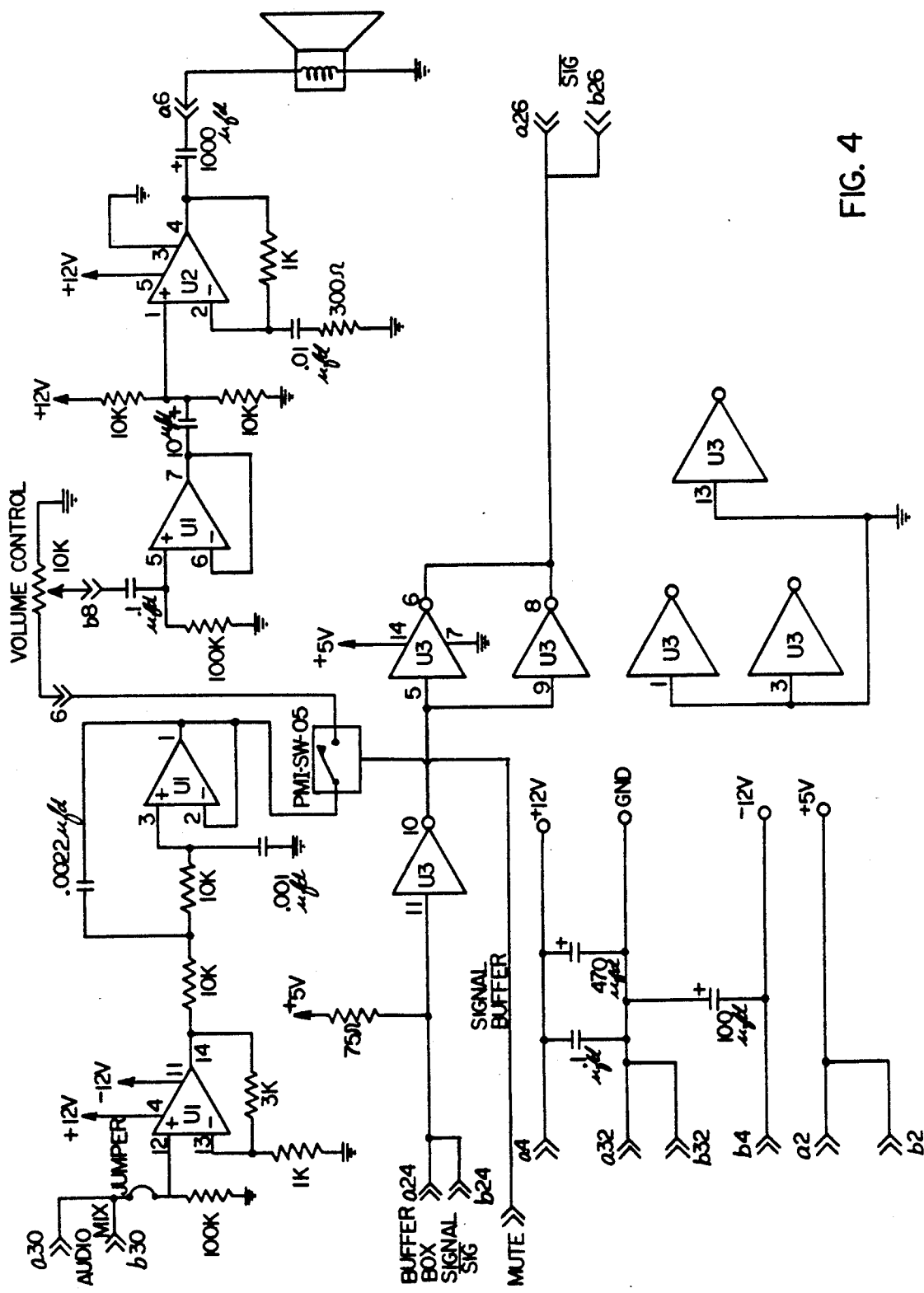
FIG. 4 is an electrical schematic illustrating the audio amplifier sub-circuit.

As illustrated in FIG. 1 the auditory display instrument is connected to the electronic circuit to be sampled by some type of circuit tapping means such as a probe(s) 12 which initially and selectively supplies at least one electronic signal from a point or between points of the electrical circuit to be analyzed. A buffer box or input buffer 14 (FIG. 3) receives the signal from probe 12 and divides it into one signal which is transmitted onto the oscilloscope (in situations where the auditory display is used in conjunction with an oscilloscope) and another branch is transmitted onto the audio amplifier and filter 100 (FIG. 4). The buffer 14 of FIG. 3 is designed to receive a digital signal, however, analog signals may also be analyzed by replacing buffer 14 with the converter sub-circuit of FIG. 10. At times when the probe is not connected, no signal is detected and the instrument emits no sound.

After buffering, the signal is transmitted to the electrical bus 10 from whence it is made available to each of the audibly differentiable waveform generating sub-circuits 200, 300, 400, 500, and 600. The conversion technique within each sub-circuit will be described hereinafter, however, it will suffice to say at this point that in the underwidth pulse detection circuit 200, short signals such as undesirable transients caused by timing problems are detected and result in short bursts of noise, hereinafter referred to as "chiff." In the delayed sample sub-circuit 300, the logic state of a signal is sensed and converted to "ticks" or "tocks" indicating the state of the signal at the time of the sampling.

The mean duty cycle is continually averaged over 10 or 100 milliseconds and displayed in the form of the pitch of a tone by sub-circuit 400; the higher the duty cycle, the higher the pitch. Shorter term duty cycles, which are integrated over periods of time ranging from 10 microseconds to 1 millisecond, affect the volume of the higher and lower harmonics around the pitch of the mean duty cycle, such harmonics being generated in sub-circuit 500. Activity level which results from a change of state of the sampled signal, is indicated with mid frequency clicks generated in sub-circuit 600.

All of the above signals generated by sub-circuits 200, 300, 400, 500, and 600 are returned to the node of the audiomixer, the electrical bus line 10, and output either individually or collectively through the audio amplifier sub-circuit 100 to either a speaker 20 or a set of earphones 22. A volume control 18 is provided in a well known manner. The audio amplifier is controlled by the probe contact detection circuit (FIG. 3), which mutes the amplifier in the absence of probe contact.

Turning now to FIG. 2 there is illustrated the front panel of the instrument housing H. On the left side of housing H is incorporated the speaker 20. The remainder of the housing contains six smaller panels A-F behind which are housed the main controls and the controls for the various sub-circuits. In this regard, small main input/output control panel A includes a jack for headphones 22, the volume control 18, a main power switch 19, and the plug receptacle 21 for buffer 14 through which the sampled signal is fed. Power for the buffer and the probe contact mute signal are applied through connector 23.

Panel B includes the controls for the short term duty cycle sub-circuit 500, such controls including an on-off switch 44 and a selector switch 42 for determining whether the samples are to be integrated with a time constant of 10 microseconds or 1 millisecond. Panel C is the control panel for the mean duty cycle sub-circuit 400 and includes an on-off switch 40 and a selector switch 38 for selectively integrating the signal with time constants of 10 milliseconds or 100 milliseconds. Panel D includes the controls for the sample delay sub-circuit 300 which controls include an on-off switch 36, a continuous change switch 34, a polarity switch, and a rotary selector switch by which the operator can select sample delays ranging from 100 nanoseconds to 30 milliseconds. In panel E, the underwidth pulse sub-circuit 200 is controlled with an on-off switch 28, a polarity switch 26, and a rotary selector switch again having the ability to set minimum pulse widths of times in the range of 100 nanoseconds to 30 milliseconds. Finally, in panel F the activity level sub-circuit 600 is controlled by an on-off switch 52, a reset switch 50, a polarity switch 48, and a rotary selector switch 46 by means of which the frequency of output clicks can be changed to be produced after 1 to 100,000 positive or negative state changes of the signal.

Figure 10B:
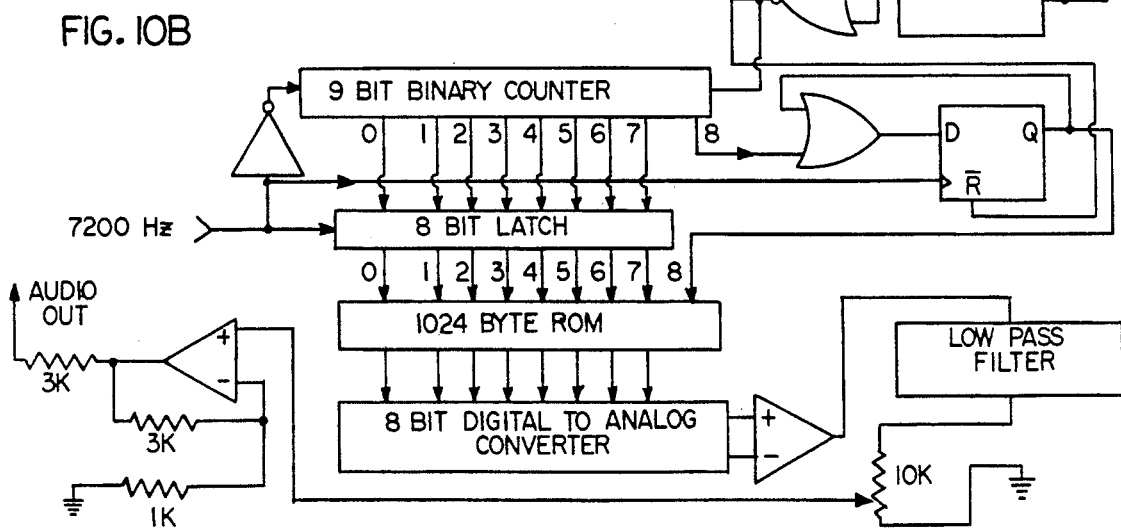

The above characteristics are representative of features of a digital signal that are often desired to be sampled or analyzed. There are other features of the signals which are capable of being analyzed and considered to be within the scope of the present invention. Such other features include the analyzing or measuring or displaying of signal repetition which comprises the comparison of one waveform pattern to an earlier waveform pattern to see if the patterns are constant (FIG. 10). This sub-circuit could be in addition to or substituted for one of the sub-circuits outlined hereinabove. It is suggested that the signal repetition sub-circuit would utilize a voiced stopped consonant as a useful display sound.

Examples of this type of sound include: "maaa . . . ", "baaa . . . "; "naaa . . . ", etc. An example of the signal repetition sub-circuit is set forth in FIG. 10.

FIG. 11 is illustrative of an analog to digital conversion circuit which could replace or augment the buffer box 14.

The sampled signal from probe 12 is initially delivered to the input buffer 14 where the signal is split, and a portion of the signal is passed on to the oscilloscope without change. The remaining portion is buffered in the circuit illustrated in FIG. 3 and passed on to the input/output circuit 100. In FIG. 3 the following Table I identifies the various electrical components not otherwise identified on the electrical schematic of FIG. 3 itself:

TABLE I

| Item No. | Electrical Designation | Description |
| --- | --- | --- |
| $U_1$ | LM 710 | Voltage comparator |
| $Q_1$ | 2N5911 | Dual FET Transistor |
| $Q_2$ | 2N4124 | NPN Transistor |
| $Q_3$ | 2N4126 | PNP Transistor |
| $Q_4$ | 2N3904 | NPN Transistor |

As illustrated in FIG. 1 the signal is delivered from the input buffer 14 to the input/output (I/O) sub-circuit 100. FIG. 4 is an electrical schematic of the I/O sub-circuit and in this schematic representation, the following items are identified:

TABLE II

| Item No. | Electrical Designation | Description |
| --- | --- | --- |
| $U_1$ | TL084 | Quad Operational Amplifier |
| $U_2$ | ULN3701 | Power Amplifier |
| $U_3$ | 74F04 | Hex Inverter |
| $U_4$ | SW-05 | Analog Switch |

PULSE WIDTH ANALYSIS

The time duration, or width, and polarity of the digital pulses of the sampled circuit are important features. More directly, it may be important to know whether the pulses of the signal are of greater or less length than some preselected critical time duration. Indicators of these two conditions are very useful for recognition of and/or diagnosis of a signal. Normal speech contains many bursts of noise with fricative sounds such as "S" and "CH". The time course and frequency spectrum of noise gives it distinctive features. Noise which contains a uniform frequency distribution is termed "white" noise, and that which has a non-uniform frequency distribution is termed "pink" noise.

Sub-circuit 100 generates short bursts of white noise or "chiff" sounds in response to pulse widths of less than a switch-selectable criteria. Switch 24 is the device by which the operator sets the standard pulse length against which the sample signal is to be tested. Thus, "glitches" or short undesirable signal transitions caused by timing problems can be detected. The following Table III identifies the electrical components of FIG. 5 which are not otherwise indicated directly on the schematic itself.

TABLE III

| Item No. | Electrical Designation | Description |
| --- | --- | --- |
| $U_1$, $U_{24}$ | 74S04 | Hex Inverter |
| $U_2$, $U_3$, $U_9$, $U_{21}$ | 74F74 | Dual "D" Flip-Flop |
| $U_4$, $U_{22}$ | 74F02 | Quad 2-input NOR Gate |
| $U_5$ | 74123 | Dual One-Shot Multivibrator |
| $U_6$ | TL084 | Amplifier (Quad) |
| $U_7$ | MM5437 | Digital Noise Generator |
| $U_8$, $U_{20}$, $U_{23}$ | 74S00 | Quad 2-input NAND Gate |
| $U_{10}$-$U_{14}$ | 7490 | Decade Counter |
| $U_{15}$ | 74S197 | P/S Binary Counter |
| $U_{16}$ | 7440 | Dual 4-input NAND Gate |
| $U_{17}$, $U_{18}$ | 74S30 | 8-input NAND Gate |
| $U_{19}$ | 74S86 | Quad 2-input EXCLUSIVE-OR Gate |

SIGNAL LEVEL SAMPLING

Sampling of the logic state of a digital electronic signal (whether it be 1 or 0) which occurs a specified time after a transition of selected polarity results in an indication of pulse duration. If logic pulses are to have some known duration, there should be no change in the sound signal generated by this sub-circuit after the first tick or tock unless there is a duration change. A change from "tick" to "tock" or vice versa would indicate a change of pulse duration. In the continuous mode a series of ticks or tocks will be produced, one for each sample. In the change mode no sound occurs until there is a sampled level change.

The sub-circuit 300 is schematically illustrated in FIG. 6 with the identification of the components thereof set forth in the following table:

TABLE IV

| Item No. | Electrical Designation | Description |
| --- | --- | --- |
| $U_1$ | 74S04 | Hex Inverter |
| $U_2$ | 74S86 | Quad 2-input EXCLUSIVE-OR Gate |
| $U_3$-$U_6$ | 74F74 | Dual "D" Flip-Flop |
| $U_7$ | 7432 | Quad 2-input OR Gate |
| $U_8$ | 7408 | Quad 2-input AND Gate |
| $U_9$ | 7400 | Quad 2-input NAND Gate |
| $U_{10}$ | 74F02 | Quad 2-input NOR Gate |
| $U_{11}$, $U_{13}$, $U_{14}$ | TL082 | Amplifier (Dual) |
| $U_{12}$, $U_{15}$ | 74123 | Dual One-Shot Multivibrator |

DUTY CYCLE

The ratio of the amount of time that the sampled signal spends in the high state versus the low state is the average duty cycle. A 50%/50% square wave is symmetrical and the extremes are 100% high and 100% low. A signal which undergoes a step transition from a constant low state to the high state undergoes the maximum change in mean duty cycle. If a signal is integrated over some time period a measure of the mean duty cycle is available. The integration time constant will affect the nature of the result. A long time constant reveals gross variations while a short time constant will reveal short term duty cycle changes.

Pitch is the apparent frequency or tone of a sine wave. Changes in pitch can be discrete or smooth. The auditory system is sensitive to both kinds of changes but is relatively poor at estimating absolute pitch other than high or low. The human voice does not generate a pure sine wave, but a series of pulses which generates harmonics or multiples of the fundamental frequency. It is the harmonics of the sounds of speech which gives it great individuality and conveys much meaning and emotion. Such quality is called "timbre" and is the harmonic content of the sound which makes, for example, an oboe and a flute sound so differently.

Mean duty cycles are integrated according to sub-circuit 400 (10-100 m.s.) and are heard in the basic pitch of a complex tone; the higher the duty cycle the higher the pitch. More rapid changes in duty cycle (short term) indicating rapid changes of a waveform are integrated over a time period ranging from 10 microseconds to 1 m.s. Such results affect the volume of the higher and lower harmonics around the pitch. Thus the timbre or quality of the sound will change in a meaningful and repeatable manner. The decay time for the short term duty cycle channels are long enough that a rapidly changing signal will display both the higher and lower harmonics. A square wave with 50% duty cycle will produce no harmonics, just a pure mid-frequency tone. A step change up in signal state produces first a shift to a higher harmonic and then a glide change upwardly in pitch.

The details of the pitch forming sub-circuit 400 and the harmonics forming sub-circuit 500 are set forth in FIGS. 7 and 8 responsively. Tables V and VI below provide identifying information of the components of such sub-circuits.

TABLE V

| Item No. | Electrical Designation | Description |
|---|---|---|
| $U_1$ | 74S04 | Hex Inverter |
| $U_2$ | DG211 | Analog Switch (Quad) |
| $U_3$ | ADVFC32KN | Voltage Controlled Oscillator |
| $U_4$ | 7474 | Dual "D" Flip-Flop |
| $U_5, U_6,$ $U_7$ | 7493A | 4 Bit Binary Counter |
| $U_8$ | 2764 | E-PROM |
| $U_9$ | 74LS273 | Octal D Flip-Flop (Latch) |
| $U_{10}$ | DAC0801LC | Digital-Analog Converter |
| $U_{11}$ | TL084 | Amplifier |
| $U_{12}$ | 7400 | Quad 2-input NAND Gate |

TABLE VI

| Item No. | Electrical Designation | Description |
|---|---|---|
| $U_1, U_2$ | 7404 | Hex Inverter |
| $U_3, U_4$ | 7493A | 4 Bit Binary Counter |
| $U_5, U_6$ | TL 084 | Amplifier (4) |
| $U_7$ | TL 082 | Amplifier (2) |
| $U_8$ | DG 211 | Analog Switch (Quad) |
| $Q_1$ | 2N5640 | Field Effect Transistor |

ACTIVITY LEVEL

The rate at which a signal changes states is obviously a very important feature of the signal as are changes in state. The simplest activity level is simply a change from one state to another (high to low or vice versa). Many digital electronic circuits produce signals with activity rates well above the threshold of hearing. In the activity level sub-circuit 600, high frequency clicks are generated responsive to the rate of state changes. Selector switch 46 enables the operator to selectively cause sub-circuit 600 to produce a click after each 1, 10, 100, 1000, 10,000, or 100,000 state changes of the signal. The circuit counts the selected number of transitions, produces a click, followed by a brief (0-10 milliseconds) pause, after which the count restarts. Thus, there is a maximum click rate which is approached exponentially with increasing activity rates. This ensures that the clicks are always within the range of human hearing no matter what the count selector setting. Activity changes are indicated by changes in the click rate. It is often useful to know simply that a line, such as interrupt or enable line, is cycling. The details of sub-circuit 600 are schematically illustrated in FIG. 9 with the components thereof identified hereinbelow in Table VII:

TABLE VII

| Item No. | Electrical Designation | Description |
|---|---|---|
| $U_1$ | 74S86 | Quad 2-input EXCLUSIVE-OR Gate |
| $U_2-U_6$ | 7490A | Decade Counter |
| $U_7, U_8$ | 7400 | Quad 2-input NAND Gate |
| $U_9$ | 7430 | 8-input NAND Gate |
| $U_{10}$ | 74123 | Dual One-Shot Multivibrator |
| $U_{11}$ | TL082 | Amplifier (2) |

REPETITIVE PATTERN COMPARISON

It is often desirable to be able to analyze a waveform for pattern repetition. A repetitive pattern comparison requires that the timing of some 2 n periods of time which constitute a repeating group be captured and compared with the timing of the previous group, wherein n is the number of positive or negative transitions within a group. The differentiable sound selected for pattern comparison is a voiced stopped consonant such as "maaa . . . ", "baaa . . . ", or "naaa . . . ". This sound is generally described as a cessation of sound for some period followed by a voiced burst which decays to some constant amplitude. The time course and harmonic content will determine the actual sound. In summary, during operation the first time a waveform group is confronted, the timing events are set in the A counters, the second time in the B counters, then back to the A counters, and so forth. The timing counter is restarted at the start of each group. If the signal timings compare within some pre-set number of timing counts between groups, each comparator will put out a logic "1." These are combined in a NAND gate which will hold a logic "0" output until one of the comparator sets detects a mismatch. At this point, a logic "1" will be output. The output of the NAND gate will be fed to an audio signal generation circuit which produces an appropriate audio display (voice stopped consonant).

The circuit illustrated in FIG. 10 must operate at a high speed for most signals. A master timer which counts up from a high speed clock pulse train provides the reference timer signals, probably 18-20 bits wide of binary counting. These counts are strobed into comparators under the control of another counter and the rising and falling edge detectors. There are two C event comparator sets, i.e. C comparators for the rising edge timing event and C comparators for the falling edge event. Each event count comparator has two up/down counters with presettable inputs. The $X_n$ counter is such that X is an integer of 1 or more, with $X_n$ always as large as possible, but less than or equal to C, the number of comparator sets.

The sub-circuit for the repetitive pattern comparison is illustrated schematically in FIG. 10. This sub-circuit is not illustrated in either FIGS. 1 or 2, but can be added as desired to the electric bus 10 and placed in an appropriate position in the housing H.

The analog-to-digital conversion circuit is illustrated in FIG. 11 and replaces the buffer circuit of FIG. 3 in situations where the analyzed signal is analog. An input buffer amplifier 80 is used to isolate the input signal and to scale its amplitude. The signal is then split into two tracks, one being transmitted through a differentiator (containing operational amplifier 82) and a full wave rectifier 84, the output of which is used to control the frequency of a voltage controlled oscillator 86. This converts the rate of change of the analog signal into the activity rate of the resulting digital signal.

The other signal varies the duty cycle of the output digital signal in response to the voltage level of the input signal. The duty cycle of VCO 86 is controlled by the voltage level of the signal. Assuming that the low and high frequency components of the signal level have different weighting, low and high pass filters 88,90 separate high and low frequency components. An adjustable resistor is used to mix the components back together with different weighting functions, passing through amplifier 92 and back to the VC086.

As described hereinabove one aspect of the present invention is to convert selected salient features of an electrical signal, or physiological or physical activity which can be converted to electrical signals, into a plurality of distinct waveforms which, in turn, are converted into a plurality of distinct selected sounds or sound patterns designed to match speech characteristics for optimal human processing. Such sounds or sound patterns can be used for analyzing or evaluating circuits; by surgeons in operating rooms to monitor various physiological functions without diverting the surgeon's visual attention; by research personnel who want to "hear" rather than to "see" physical activity; and other such applications.

While a preferred embodiment of the present invention has been described in detail hereinabove, it is apparent that various changes might be made without departing from the scope of the present invention. For example, in some installations certain ones of the sub-circuits may be utilized and certain others eliminated. Various combinations of the sub-circuits are possible depending upon the application of the audio display. The scope of the invention is to be determined by the following claims.

What is claimed is:

1. An audible display device for generating a plurality of audible distinct signals, each audible signal being representative of a salient feature of an electrical signal to be analyzed, said device comprising:
   (a) a plurality of distinctly separate, auditory signal waveform generating sub-circuits;
   (b) input means electrically connecting said sub-circuits with said electrical signal for selectively supplying at least one electrical signal to be examined to said plurality of sub-circuits;
   (c) each of said sub-circuits electronically detecting a selected salient feature of said electrical signal and producing an electrical waveform substantially dissimilar to said detected salient feature in response to the presence of said detected salient feature, each of said waveforms being representative of a distinct audible pattern of sounds and capable of being converted by a transducer to said audible pattern of sounds, said sub-circuits being able to detect at least two of the following signal characteristics: (i) pulse width; (ii) duty cycle; (iii) activity level; (iv) repetitive pattern comparison; and (v) sampled signal level; and
   (d) means for selectively audibly displaying each of said patterns of sound both individually and collectively.

2. The audible display device according to claim 1 wherein said input means further includes a buffer sub-circuit for selectively feeding said input electrical circuit to said plurality of sub-circuits and to an oscilloscope.

3. The audible display device according to claim 2 wherein said buffer sub-circuit further includes converting means for changing analog signals to digital signals.

4. The audible display device according to claim 1 wherein said means for displaying each of said patterns of sound include a speaker and headphones.

5. The audible display device according to claim 1 wherein said input means includes an electric bus over which said input digital electrical signals to said sub-circuits and said electrical waveforms from said sub-circuits are transmitted.

6. The audible display device according to claim 1 wherein one of said sub-circuits includes electrical means for counting state changes of said input circuit and generating an electrical waveform representative of a click at selected intervals.

7. The audible display device according to claim 1 wherein one of said sub-circuits includes electrical means for sampling pulses of said input circuit and generating an electrical waveform representative of a short burst of white noise in the event the pulse width is outside the limits of a prescribed time duration.

8. The audible display device according to claim 1 wherein a pair of said sub-circuits include electrical means therein for sensing the ratio of time the input signal is in the high state versus the time the input signal is in the low state and generating electrical waveform representative of pitch and harmonics responsive thereto.

9. The audible display device according to claim 1 wherein one of said sub-circuits includes electrical means for periodically sampling the logic state of said input signal and generating electrical waveforms representative of one of two differentiable sounds dependent on the state of the input signal at the time of the sample, means for storing said electrical waveforms and means for audibly displaying such sounds where a change in the sampled state is detected to indicate a change in pulse configuration.

10. The audible display device according to claim 9 wherein said means for generating electrical waveforms representative of one of two differentiable sounds includes generating means for "tick" sounds and generating means for "tock" sounds.

11. The audible display device according to claim 1 wherein one of said sub-circuits includes means for comparing events in a group of pulses with the corresponding events in a previous pulse group and generating an electrical signal responsive thereto representative of either a match or a mismatch in the form of a voice stopped consonant.

12. The audible display device according to claim 1 wherein one of said sub-circuits includes electrical means for counting state changes of said input circuit and generating an electrical waveform representative of a click at selected intervals and another of said sub-circuits includes electrical means therein for sensing the ratio of time the input signal is in the high state versus the time the input signal is in the low state and generating electrical waveforms representative of pitch and harmonics responsive thereto.

13. The audible display device according to claim 12 wherein one of said sub-circuits includes electrical means for sampling pulses of said input circuit and generating an electrical waveform representative of a short burst of white noise in the event the pulse width is outside the limits of a prescribed time duration.

14. The audible display device according to claim 12 wherein one of said sub-circuits includes means for comparing events in a group of pulses with the corresponding events in a previous pulse group and generating an electrical waveform responsive thereto representative of either a match or a mismatch in the form of a voice stopped consonant.

15. The audible display device according to claim 12 wherein one of said sub-circuits includes electrical means for periodically sampling the logic state of said input signal and generating electrical waveforms representative of one of two differentiable sounds dependent on the state of the input signal at the time of the sample, means for storing said electrical waveforms and means for audibly displaying such sounds where a change in the sampled state is detected to indicate a change in pulse configuration.

16. Method of displaying aurally a plurality of salient of at least one electrical signal comprising the steps of:

(a) electrically sensing a signal and transmitting said sampled signal to an audible signal generating circuit;

(b) separately detecting selected features of said sampled signal, said detected features including at least two of the following signal characteristics: (i) pulse width; (ii) duty cycle; (iii) activity level; (iv) repetitive pattern comparison; and (v) sampled signal level;

(c) producing an electrical waveform substantially dissimilar to said detected salient feature in response to the presence of said detected feature, each of said waveforms being capable of generating audibly differentiable, yet distinctively blendable sounds; and (d) converting and displaying said waveforms as audible sounds to an operator.

17. The method according to claim 16 wherein said audible display is selectively transmitted to said operator individually and collectively.

18. The method according to claim 16 wherein said generated sounds are selected from the group containing clicks, pitch, harmonies, ticks and tocks, bursts of white noise, and voiced stopped consonants.

19. The method according to claim 16 wherein said electrical signal is formed by the conversion of physiological activity thereto.

20. The method according to claim 16 wherein said electrical signal is formed by the conversion of physical activity thereto.

* * * * *